United States Patent [19]

Inoue

[11] Patent Number: 5,077,596

[45] Date of Patent: Dec. 31, 1991

[54] SEMICONDUCTOR DEVICE

[75] Inventor: Akira Inoue, Itami, Japan

[73] Assignee: Mitsubishi Denki Kabushiki Kaisha, Japan

[21] Appl. No.: 554,857

[22] Filed: Jul. 20, 1990

[30] Foreign Application Priority Data

Feb. 1, 1990 [JP] Japan .................................. 2-23896

[51] Int. Cl.[5] .................... H01L 27/02; G01R 1/06
[52] U.S. Cl. ...................................... 357/41; 357/51; 357/68; 324/149; 324/537
[58] Field of Search .............................. 357/41, 51, 68; 324/149, 537

[56] References Cited

U.S. PATENT DOCUMENTS 4,819,038 4/1989 Alt ........................................ 357/51

Primary Examiner—Edward J. Wojciechowicz
Attorney, Agent, or Firm—Leydig, Voit & Mayer

[57] ABSTRACT

A semiconductor device in which a plurality of circuit elements are disposed on a chip, and the respective circuit elements are connected to each other by a transmission line and an input/output probe pad for contacting a high frequency probe at opposite ends of the chip. The transmission line connecting respective circuit elements includes a separating section for connecting and disconnecting elements and an auxiliary probe pad that may be contacted by a high frequency probe disposed between the circuit elements.

11 Claims, 5 Drawing Sheets

SEMICONDUCTOR DEVICE

FIELD OF THE INVENTION

The present invention relates to a semiconductor device, and more particularly to a construction for evaluating a microwave monolithic integrated circuit (hereinafter referred to as "MMIC") at a high frequency such as microwaves and millimeter waves.

BACKGROUND OF THE INVENTION

FIG. 6 is a plan view showing a plan structure of a prior art semiconductor device and FIG. 7 shows an equivalent circuit thereof. FIG. 8 is a diagram showing a prior art semiconductor device in a wafer. In these figures, reference numeral 100 designates a semiconductor wafer. A first and a second circuit (i.e., circuit elements) 2 and 3, respectively, are disposed on respective chip regions 10 of the semiconductor wafer 100. These circuits 2 and 3 are connected with each other by a transmission line 5. Herein, the first circuit 2 is a low noise amplifier and the second circuit 3 is a high power amplifier.

An input side transmission line 5a connected with the first circuit 2 is disposed at one end portion of the chip region 10. A microwave input side RF probe pad 1a connected with a grounding electrode at the rear side of wafer is disposed at the both sides of the transmission line 5a. An input side coplanar line 15a is constituted by the input side transmission line 5a and the input side pad 1a.

An output side transmission line 5b connected with the second circuit 3 and the microwave output side RF probe pad 1b are disposed at the other end portion of he chip region 10. An output side coplanar line 15b is constituted by the output side transmission line 5b and the output side RF probe pad 1b.

The chip regions 10 are divided into a plurality of chips by dicing after the wafer process is completed, thereby producing a plurality of semiconductor devices.

On-wafer microwave evaluation of such a semiconductor device is carried out as in the following.

The input side RF probe 50a is contacted with the input side coplanar line 15a and the output side RF probe 50b is contacted with the output side coplanar line 15b. A measurement current is supplied through the first and second circuits 2 and 3 via the probes 50a and 50b in this state to carry out an evaluation of microwave characteristics of both circuits 2 and 3.

In the prior art semiconductor device constructed as described above, the supply,. of a measurement current is carried out by contacting the RF probes 50a and 50b in contact with the input side and output side coplanar lines 15a and 15b, respectively, and therefore, only the characteristics of the whole of the first and second circuits 2 and 3 is obtained in the on-wafer evaluation. Therefore, when the characteristics of the semiconductor devices are bad, it was difficult to determine which of the first or second circuits 2 or 3 is faulty.

The above-described prior art semiconductor device has only two circuit elements, i.e., first and second circuits 2 and 3 for description. A large sized integrated circuit having a larger number of circuit elements has greater difficulty in the fault analysis, resulting in a serious problem.

SUMMARY OF THE INVENTION

The present invention is directed to solving the above-described problems and has for its object to provide a semiconductor device for on-wafer evaluation of microwave characteristics for each circuit element and simple detection as to which circuit element is faulty.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

In accordance with the present invention, a transmission line for mutually connecting circuit elements includes a separating part for separating circuit elements at the both sides thereof at high frequencies and parts of the transmission line between the separating part and both side circuit elements are provided respectively with an auxiliary probe pad for contacting a high frequency probe. Therefore, each circuit element is separated from the other circuit element at microwave frequencies. Furthermore, a slot line or a coplanar line is produced at both sides of each circuit element and this enables probing from the surface. Each circuit element can be separately measured on wafer and fault analysis of semiconductor device is simplified.

DETAILED DESCRIPTION OF THE PREFERRED EMBODIMENTS

Embodiments of the present invention will be described in detail with reference to the drawings.

Figure 1:
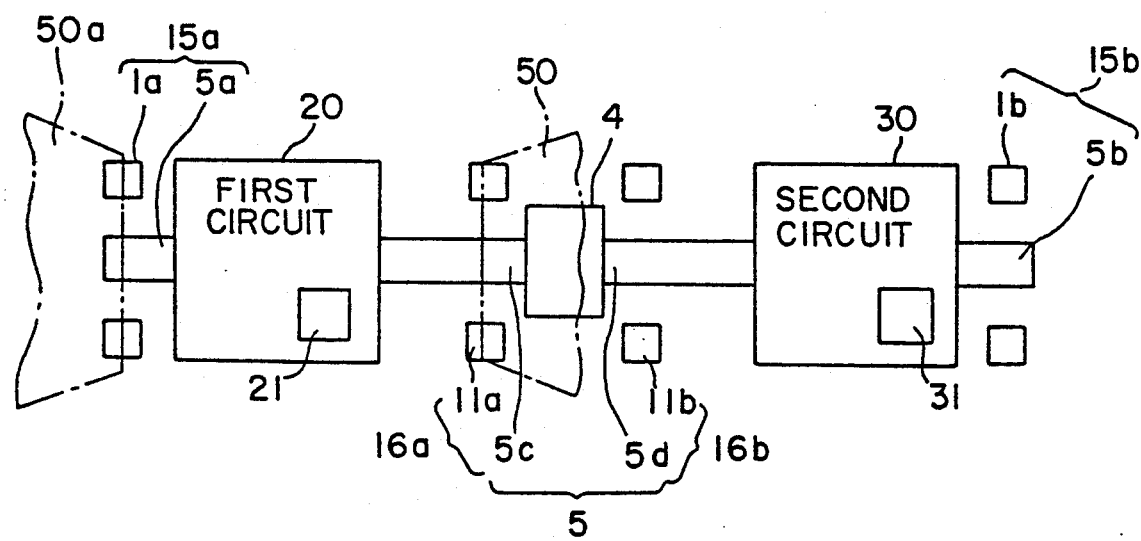
FIG. 1 is a plan view of a semiconductor device in accordance with a first embodiment of the present invention.
Figure 2:
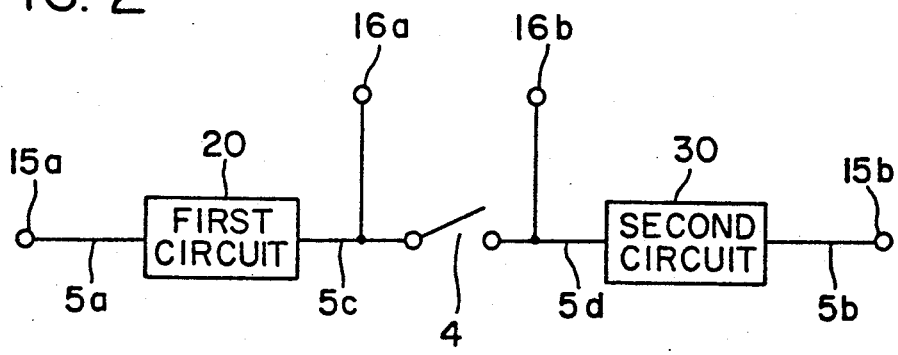
FIG. 2 is a diagram showing an equivalent circuit of the semiconductor device of FIG. 1.
Figure 6:
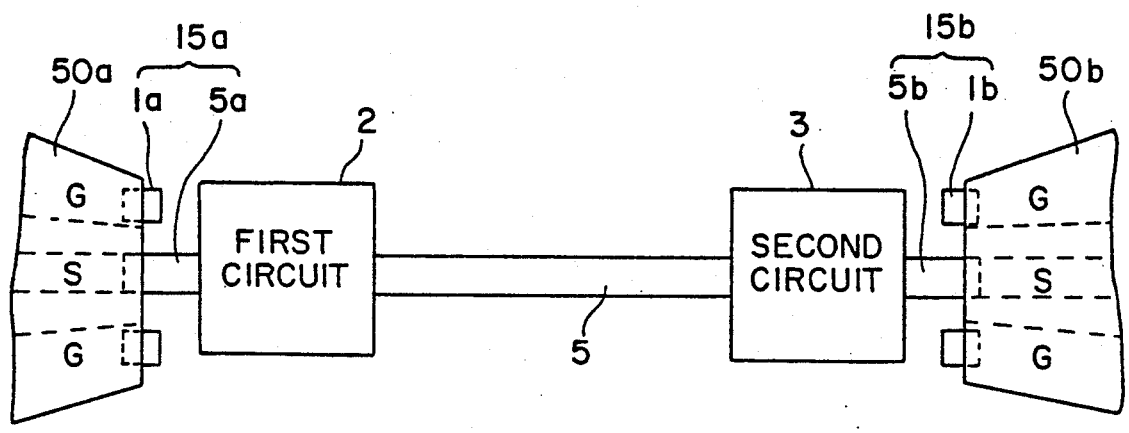
FIG. 6 is a plan view showing a plan structure of a prior art semiconductor device.
Figure 7:
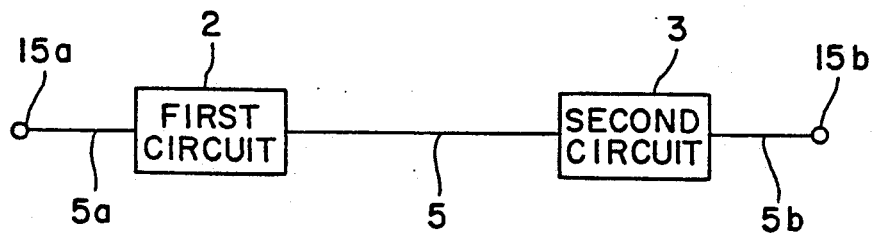
FIG. 7 is a diagram showing an equivalent circuit of the semiconductor device of FIG. 6.
Figure 8:
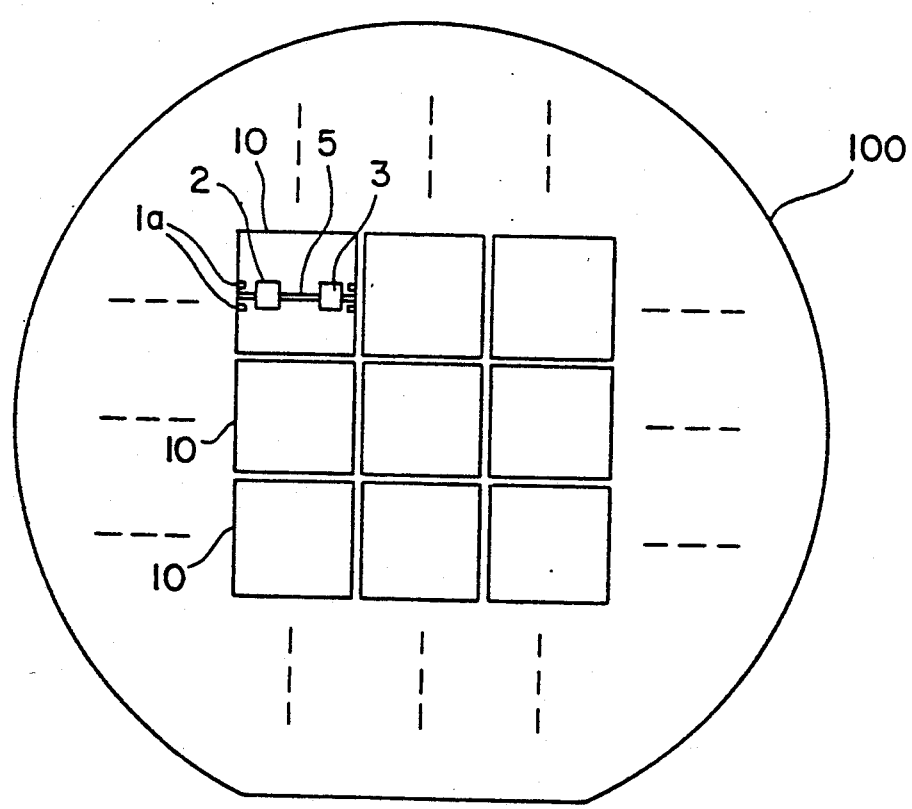
FIG. 8 is a diagram showing a prior art semiconductor device in a wafer.

FIG. 1 is a plan view of a semiconductor device in accordance with a first embodiment of the present invention and FIG. 2 shows an equivalent circuit thereof. In these figures, the same reference numerals as those shown in FIGS. 6 and 7 designate the same or corresponding elements. A first circuit 20 and a second circuit 30 (i.e., circuit elements) are provided on the respective chip regions of the wafer. Herein, the first circuit 20 is a low noise amplifier and the second circuit 30 is a high power amplifier. Coplanar lines 15a and 15b are provided at the input side of the circuit 20 and the output side of the circuit 30, respectively. The circuits 20 and 30 include characteristics modifying circuits 21 and 31 for correcting the characteristics of the amplifiers 20 and 30 respectively.

A switching circuit (separating section) 4 which disconnects or connects the circuits 20 and 30 at microwave frequencies is provided on the transmission line 5. The switching circuit 4 is turned on or off by applying a voltage or current from outside.

An auxiliary probe pad 11a for contacting by an RF probe 50b is provided at the both sides of the transmission line 5c between the switching circuit 4 and the first circuit 20. An auxiliary coplanar line 16a is constituted by the probe pad 11a and the transmission line 5c. Similarly, an auxiliary probe pad 11b is provided at the both sides of the transmission line 5d between the switching, circuit 4 and the second circuit 30. An auxiliary coplanar line 16b is constituted by the probe pad 11b and the transmission line 5d.

Figure 5A:
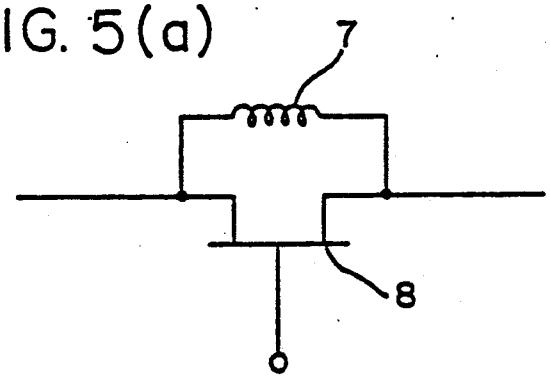
FIG. 5(a) is an equivalent circuit of a switching circuit which is used in an embodiment of the invention.
Figure 5B:
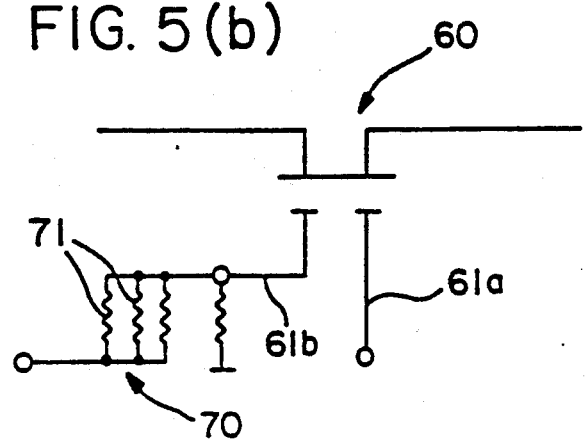
FIG. 5(b) is a diagram for explaining a construction of a characteristics modifying circuit which is mounted on a circuit element of an embodiment of the invention.

FIG. 5(a) shows a concrete example of the switching circuit 4, wherein an inductor 7 is connected in parallel with the source and drain of an FET 8. In this circuit, an off state is realized by designing so that the source-drain capacitance of FET 8 and the inductor 7 resonate at a desired frequency. That is, the source-drain capacitance is varied by varying the gate voltage of FET 8, thereby resulting an off state of the switch. FIG. 5(b) shows a variable gain amplifier comprising a dual gate FET 60 and a resistor 70 for adjusting the voltage as an example of the modifying circuits 21 and 31. The FET 60 comprises a main gate electrode 61a and a control gate electrode 61b, and the electrode 61b is connected with a resistor 70. The resistor 70 comprises resistor elements 71 which are connected in parallel with each other, and the resistance value is changed by selectively disconnecting the resistor elements 71 by such as a laser beam. The characteristics of the circuits 20 and 30 are modified by. that the voltage of ,the electrode 61b is changed so selectively disconnecting the resistor elements 71 to adjust the threshold value of the FET 60.

A description is given of function and effect of this embodiment.

A wafer evaluation of the semiconductor device of the present invention is carried out as in the following.

First of all, when evaluation of the first circuit 20 is carried out, an input side RF probe, 50a is contacted with the input side coplanar line 15a of the first circuit 20 and an output side probe 50b is contacted with the output side auxiliary coplanar line 16a. A gate voltage is applied to the FET 8 of the switching circuit 4 to turn off the switching circuit 4. The first circuit 20 and the second circuit 30 are thus disconnected from each other at microwave frequencies. A measurement current is supplied to the circuit 20 from the probe in this state to carry out on-wafer evaluation of the circuit 20 only. The on-wafer evaluation of the second circuit 30 is carried out similarly as that of the first circuit 20.

When a variation in the characteristics of the first circuit 20 is detected as a result of the above-described evaluation, the resistance value of the resistor 70 of the characteristics modifying circuit 21 is adjusted to modify the characteristics of the circuit 20. When the evaluation and modification of the characteristics are completed, the voltage application to the gate of the FET 8 is removed to return the switching circuit 4 to an ON state. Then, the circuits 20 and 30 are connected and the semiconductor device performs its original function.

In this embodiment, a switching circuit 4 which disconnects or connects the circuits 20 and 30 at microwave frequencies is provided on the signal transmission line 5 which connects the input side of first circuit 20 and the output side of second circuit 30, and auxiliary probe pads 11a and 11b are provided between the switching circuit 4 and the first and second circuits 20 and 30, respectively. Therefore, the respective circuit can be separated from the other circuit at microwave frequencies and coplanar lines 16a and 16b produced at both sides of the circuit, enable probing from the surface. Therefore, the circuits 20 and 30 can be measured on wafer separately and a fault analysis of a semiconductor device is easily performed.

Furthermore, since the first and second circuits 20 and 30 are constructed to have modifying circuits 21 and 31 for modifying characteristics, variations in the characteristics can be modified by the characteristics modifying circuits 21 and 31, whereby the yield of a semiconductor device is enhanced.

Although the above-described embodiment includes two, circuit elements, the device can include three or more circuit elements.

Figure 3:
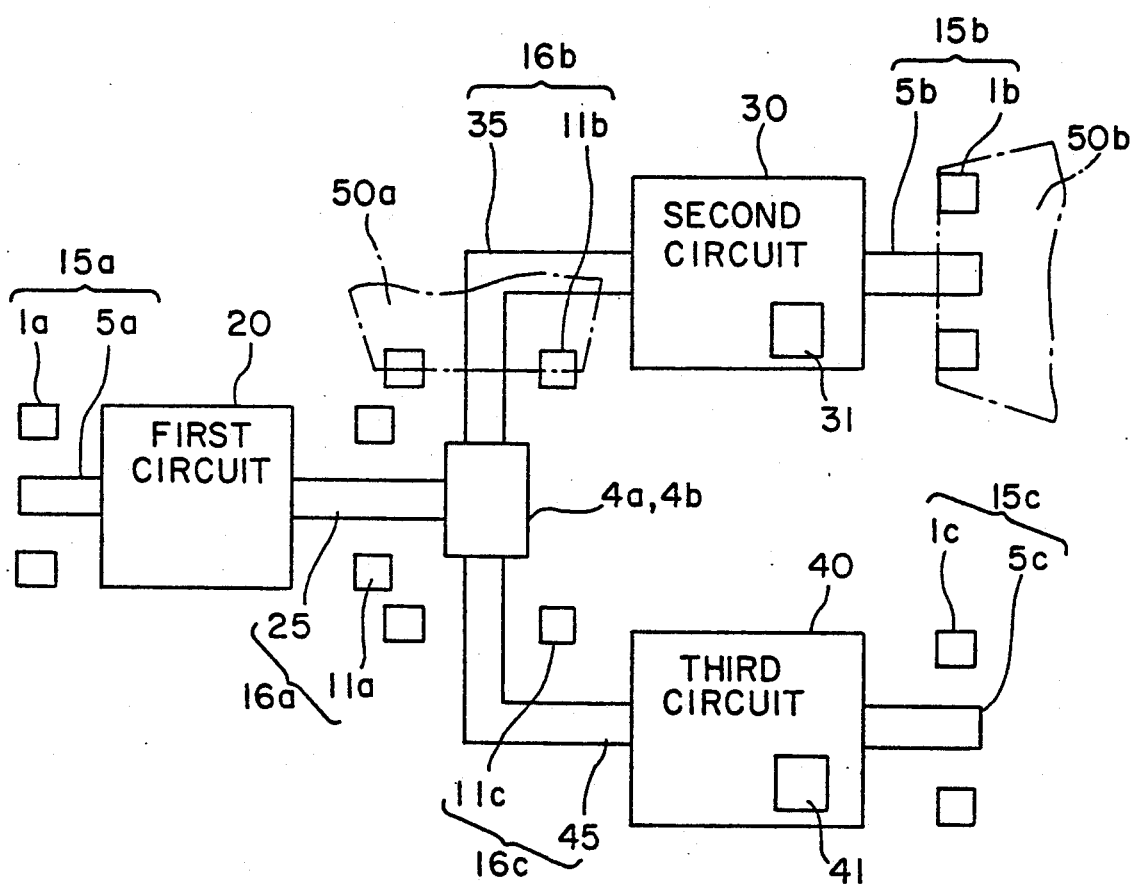
FIG. 3 is a plan view showing a plan structure of a semiconductor device in accordance with a second embodiment of the present invention.
Figure 4:
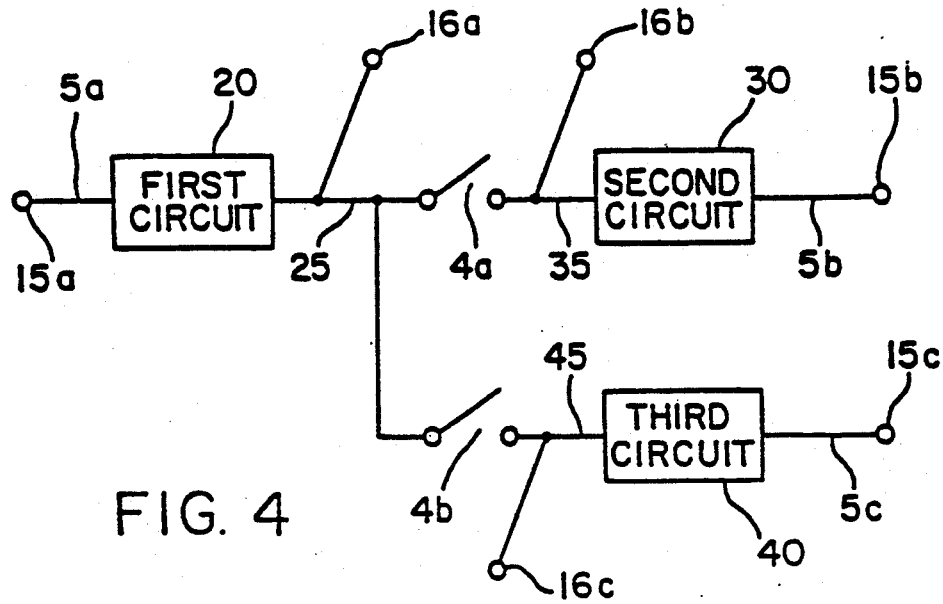
FIG. 4 is a diagram showing an equivalent circuit of a semiconductor device of FIG. 3.

FIG. 3 shows a plan structure of a semiconductor device having three circuit elements as a second embodiment of the present invention and FIG. 4 is a diagram of an equivalent circuit thereof. In these figures, the same reference numerals as those shown in FIGS. 1 and 2 represent the same or corresponding portions. This semiconductor device is an input/output module of a radar.

Reference numerals 20, 30, and 40 respectively designate a first, a second, and a third circuit which constitute the module. The circuit 20 is a phase shifter, the circuit 30 is a low noise amplifier, and the circuit 40 is a high power amplifier. The circuits 30 and 40 include modifying circuits 31 and 41 for modifying their characteristics.

A first switching circuit 4a is provided between the circuits 20 and 30 while a second switching circuit 4b is provided between the circuits 20 and 40. These switching circuits 4a and 4b disconnect or connect the respect circuits at microwave frequencies. These switching circuits 4a and 4b comprise an FET 8 and an inductor 7, respectively, similarly as the switching circuit 4.

Furthermore, auxiliary probe pads 11a are provided at the both sides of the transmission line 25 which connects, the switching circuit 4a and the circuit 20. The pads 11a are grounded at high frequencies. A coplanar line 16a comprises the transmission line 25 and the pad 11a. Auxiliary probe pads 11b are provided between the circuit 30 and the switching circuit 4a, and an auxiliary coplanar line 16b comprises by the transmission line 35 and the pad 11b. An auxiliary probe pad 11c is provided between the circuit 40 and the switching circuit 4b, and an auxiliary coplanar line 16c comprises by the transmission line 45 and the pad 11c. A transmission line 5c and an input/output probe pad 1c are provided in the neighborhood of the circuit 40, and an input/output coplanar line 15c comprises the transmission line 5c and the pad 1c.

A description is given of the function and effect of this second embodiment.

The fundamental operation of this second embodiment of such a construction is as follows. That is, a signal from the signal processing section at a prior stage to the first circuit (phase shifter) 20 is input to the side of the third circuit (high power amplifier) 40 by the switching circuits 4a and 4b, and the amplified output thereof is supplied to an antenna. The received signal from the antenna is introduced to the signal processing section through the switching circuit 4a and the phase shifter 20.

The on-wafer evaluation of this embodiment is carried out similarly as the first embodiment.

That is, when an on-wafer evaluation of the second circuit 30 as a low noise amplifier is ,carried out, an RF probe 50a is put on the auxiliary coplanar line 16b of the circuit 30 an RF probe 50b is put on the input/output coplanar line 15b, and a gate voltage is supplied to the FET 8 of the switching circuit 4a to turn off the FET 8. By this operation, the circuit 30 is separated from the other circuits 20 and 40 at microwave frequencies. An on-wafer evaluation is carried out by supplying a measurement current to the circuit 30 in this state. Also for the third circuit 40 as a high power amplifier, the switching circuit 4b is turned off and probing is carried out at the input/output coplanar line 15c and the auxiliary coplanar line 16c in this state.

When a variation in the characteristics of the respective circuits 30 and 40 is detected as a result of this evaluation, the characteristics are adjusted by the modifying circuits 31 and 41.

In this second embodiment, the utilization efficiency of the elements is high because a switching circuit required for the operation of the apparatus itself is used in common with the switching circuit which is required for the on-wafer measurement.

In the above-illustrated first and second embodiments, a switching circuit is utilized as a separating section of a transmission line, but the separating section of the transmission line can be a structure that can be disconnected by such as a laser and the circuit at the both sides, of the transmission line can be separated at microwave frequencies by laser trimming.

Although in the above-illustrated embodiments matching of the characteristic impedance between the input/output and auxiliary coplanar line and the RF probe is not considered, it is possible to avoid microwave reflections gone while the RF probe is in contact by making the impedances equal to each other, thereby enabling an accurate microwave frequency evaluation. Herein, the matching of the impedance can be carried out by adjusting the width of the transmission line.

In the above-illustrated embodiment, the line at the contact section with the RF probe is a coplanar line which has grounding pads at the both sides of the signal line, but the line configuration is not limited thereto, and a slot line having one grounding pad at one side of the signal line can be used.

As is evident from the foregoing description, according to the present invention, a transmission line for connecting circuit elements has a separating section at the both sides of the transmission line for separating the circuit elements at high frequencies. An auxiliary probe pad for contacting by a high frequency probe is arranged at a line portion between the separating section and the circuit elements. Therefore, respective circuit elements can be separated from each other at microwave frequencies and a slot line or a coplanar line is produced at the both sides of the circuit elements, thereby enabling a probing from the surface. As a result, microwave characteristics of the respective circuit elements inside the semiconductor device can be evaluated independently, and fault analysis of a semiconductor device can be easily carried out.

What is claimed is:

1. A semiconductor device comprising:
   a plurality of circuit elements disposed on a semiconductor chip;
   a transmission line connecting the respective elements on a chip to each other;
   input and output probe pads for contacting with a high frequency probe disposed adjacent respective circuit elements;
   separation means for disconnecting the respective circuit elements from each other, said separating means being disposed on both sides of the transmission line; and
   auxiliary probe pads for contacting with a high frequency probe respectively disposed between said separation means and each of said circuit elements.

2. A semiconductor device as defined in claim 1 wherein said separating means comprises a switching circuit for connecting and disconnecting said circuit elements.

3. A semiconductor device as defined in claim 2 wherein said circuit elements comprise a low noise amplifier and a high power amplifier.

4. A semiconductor device as defined in claim 3 wherein said switching circuit comprises a an FET having a source, a drain, and a gate terminal and an inductor connected in parallel with said source and drain terminals for switching said FET by varying the voltage applied to the gate terminal of said FET.

5. A semiconductor device as defined in claim 1 wherein said circuit elements comprise a phase shifter, a low noise amplifier, and a high power amplifier and said separating means comprises a first switching circuit for connecting and disconnecting said phase shifter and said blow noise amplifier and a second switching circuit for connecting and disconnecting said phase shifter and said high power amplifier.

6. A semiconductor device as defined in claim 5 wherein aid first and second switching circuits each comprise an FET, each having a source, a drain, and a gate terminal and an inductor connected in parallel with the source and drain terminals of each FET for selectively connecting said phase shifter to said low noise amplifier and to said high power amplifier by varying the voltages applied to respective gate terminals of said FETs.

7. A semiconductor device as defined in claim 1 wherein at least one of said circuit elements comprises characteristic alteration means for adjusting the electrical characteristics of the element for removing material removed by irradiation with an energy beam.

8. A semiconductor device as defined in claim 1 wherein said auxiliary probe pad includes pads disposed on both sides of said transmission line, and said transmission line and said auxiliary probe pad comprise a coplanar line.

9. A semiconductor device as defined in claim 1 wherein said auxiliary probe pads are disposed only on one side of said transmission line, and said transmission line and said auxiliary probe pads comprise slot lines.

10. A semicondcutor device as defined in claim 8 wherein the characteristic impedance of said coplanar line is controlled to match that of a high frequency probe.

11. A semicondcutor device as defined in claim 9 wherein the characteristic impedance of said slot line is controlled to match that of a high frequency probe.

* * * * *